United States Patent [19]
Hastings et al.

[11] Patent Number: 6,069,796
[45] Date of Patent: May 30, 2000

[54] SECURING A CARD IN AN ELECTRONIC DEVICE

[75] Inventors: Robert J. Hastings, Humble; Paily T. Varghese; Joseph R. Allen, both of Tomball, all of Tex.

[73] Assignee: Sharp, Comfort, & Merrett, P.C., Houston, Tex.

[21] Appl. No.: 09/167,631

[22] Filed: Oct. 6, 1998

Related U.S. Application Data

[63] Continuation of application No. 08/658,385, Jun. 5, 1996, Pat. No. 5,822,196.

[51] Int. Cl.[7] .............................. H05K 5/00; H05K 7/14; H01R 13/62
[52] U.S. Cl. .......................... 361/754; 361/683; 361/753; 361/798; 361/825; 439/327; 211/41.17
[58] Field of Search .................................. 361/683, 686, 361/752, 753, 754, 759, 796, 798, 825; 439/327, 372; 211/26, 41.17

[56] References Cited

U.S. PATENT DOCUMENTS

| | | | |
|---|---|---|---|
| 3,271,626 | 9/1966 | Howrilka | 361/754 X |
| 3,767,974 | 10/1973 | Donovan, Jr. et al. | 361/754 X |
| 3,853,379 | 12/1974 | Goodman et al. | 439/261 |
| 4,197,572 | 4/1980 | Aimar | 361/755 |
| 4,596,907 | 6/1986 | Lagreco et al. | 200/50 A |
| 4,628,413 | 12/1986 | Speraw | 361/798 |

(List continued on next page.)

FOREIGN PATENT DOCUMENTS

| | | |
|---|---|---|
| 0 241 905 A2 | 10/1987 | European Pat. Off. . |
| 0 254 456 A2 | 1/1988 | European Pat. Off. . |
| 2850440 | 11/1977 | Germany . |
| 3409021 | 3/1984 | Germany . |
| WO 93/15459 | 8/1993 | WIPO . |

OTHER PUBLICATIONS

IBM Technical Disclosure Bulletin, vol. 23, No. 12, page 5315, May 1981.

Maintenance & Service Guide, Compaq Deskpro XL Series Of Personal Computers; Compaq Corporation, Houston, Texas (Dec. 15, 1995).

Hot Plug Receptacle Actuated Mechanical Latch; pp. 363–364; IBM Technical Disclosure Bulletin, vol. 34, No. 6, Nov. 1991.

(List continued on next page.)

*Primary Examiner*—Jayprakash N. Gandhi
*Attorney, Agent, or Firm*—Sharp, Comfort & Merrett, P.C.

[57] ABSTRACT

An apparatus for securing an add-in circuit card in an electronic device including a clamp movably coupled to the electronic device, the clamp configured to releasably engage the card upon movement of the clamp relative from a card engagement position in which the clamp is substantially inside the electronic device to a card disengagement position in which the clamp is substantially outside the electronic device. An apparatus for securing an add-in circuit card in an electronic device including a clamp movably coupled to the electronic device, the clamp configured to releasably engage the card upon movement of the clamp from a card engagement position to a card disengagement, and a switch for controlling electrical power to the card, the switch operated by the clamp such that movement of the clamp between the engagement and disengagement positions closes and opens the switch. A method of removing a card from an electronic device having an activated power source including the steps of disengaging from the card a clamp movably coupled to the electronic device, the clamp operatively coupled to a switch that terminates power delivery to the card upon disengagement of the clamp, and extracting the card from the electronic device. A method of adding an add-in card to an electronic device having a power source, including the steps of inserting the card into the electronic device, and engaging the card clamp with a movably coupled to the electronic device, the clamp operatively coupled to a switch that activates power delivery to the card upon engagement of the clamp.

37 Claims, 8 Drawing Sheets

U.S. PATENT DOCUMENTS

| | | | |
|---|---|---|---|
| 4,835,737 | 5/1989 | Herrig et al. | 364/900 |
| 4,875,867 | 10/1989 | Hoo | 361/798 X |
| 4,999,787 | 3/1991 | McNally et al. | 364/514 |
| 5,003,431 | 3/1991 | Imsdahl | 361/798 |
| 5,010,426 | 4/1991 | Krenz | 361/726 X |
| 5,191,970 | 3/1993 | Brockway et al. | 200/335 |
| 5,247,619 | 9/1993 | Mutoh et al. | 395/325 |
| 5,268,821 | 12/1993 | Wong | 361/796 |
| 5,310,998 | 5/1994 | Okuno | 235/380 |
| 5,317,482 | 5/1994 | Bujtas | 361/798 |
| 5,317,483 | 5/1994 | Swindler | 361/801 |
| 5,428,507 | 6/1995 | Cjate et al. | 361/798 |
| 5,454,080 | 9/1995 | Fasig et al. | 395/283 |
| 5,473,499 | 12/1995 | Weir | 361/58 |
| 5,504,656 | 4/1996 | Joist | 361/754 |
| 5,513,329 | 4/1996 | Pecone | 395/281 |
| 5,530,302 | 6/1996 | Hamre et al. | 307/147 |
| 5,555,510 | 9/1996 | Verseput et al. | 364/514 |
| 5,581,712 | 12/1996 | Herrman | 395/283 |
| 5,601,349 | 2/1997 | Holt | 312/265.6 |
| 5,625,238 | 4/1997 | Ady et al. | 307/147 |
| 5,629,836 | 5/1997 | Wright | 361/755 |

OTHER PUBLICATIONS

CompactPCI™ Specification; Revision 1.0; pp. 14, 36, and 50; PCI Industrial Computers; Nov. 1, 1995.

Don Anderson; Card Bus Sytem Architecture, PC System Architecture Series, Second Edition; pp. 17–29, 39–58, 227–236, 321–361; Mindshare, Inc., Richardson, TX.; © 1996.

Don Anderson; PCMCIA System Architecture, PC System Architecture Series, Second Edition; pp. 21–83, 113–141, 145–162, 229–309, 321–332; Mindshare, Inc., Richardson, TX.; © 1995.

SECURING A CARD IN AN ELECTRONIC DEVICE

This application is a continuation of application Ser. No. 08/658,385, filed Jun. 5, 1996, now U.S. Pat. No. 5,822,196.

BACKGROUND

This invention relates to securing a card in an electronic device.

An option card used, for example, in computers typically includes a portion having a contact surface which is inserted into a slot on a mother board. The card is secured by a screw which fastens a metal bracket on the card to a shelf formed in the sheet metal chassis of the computer.

SUMMARY

In general, in one aspect, the invention features an apparatus for securing an add-in circuit card in an electronic device including a clamp movably coupled to the electronic device, the clamp configured to releasably engage the card upon movement of the clamp from a card engagement position in which the clamp is substantially inside the electronic device to a card disengagement position in which the clamp is substantially outside the electronic device.

Certain implementations of the invention include one or more of the following features. In certain implementations, the clamp: is pivotally coupled to the electronic device; is substantially quarter-circular in shape; and includes a pivot pin positioned near a center point of a circle defined by a path of movement of the clamp. In certain implementations, the electronic device includes: a computer-related device; and the computer-related device includes a personal computer or a computer expansion box. In certain implementations, the apparatus includes: a switch for controlling electrical power to the card, the switch operated by the clamp such that movement of the clamp between a card engagement position and a card disengagement position closes and opens the switch; a clamp having a cam surface which depresses and releases the switch upon movement of the clamp between the card engagement and disengagement positions; the switch is positioned opposite a pivot pin about which the clamp pivots between the card engagement and disengagement positions; a switch which controls the delivery of signals to the card; a switch which communicates with an operating system to control electrical power to the card; an indicator light operatively coupled to the switch to indicate the open or closed state of the switch; a card having a clamp engagement surface and a contact surface releasably insertable into a slot of the device, the clamp configured to exert a downward force on the engagement surface toward the slot; a downward force is exerted by a spring-loaded foot on an end of the clamp; a clamp including a finger pressing surface on an opposite end of the clamp; and an engagement surface including a metal bracket.

In general, in one aspect, the invention features an apparatus for securing an add-in circuit card in an electronic device including a clamp movably coupled to the electronic device, the clamp configured to releasably engage the card upon movement of the clamp from a card engagement position to a card disengagement position, and a switch for controlling electrical power to the card, the switch operated by the clamp such that movement of the clamp between the engagement and disengagement positions closes and opens the switch.

In general, in one aspect, the invention features an apparatus for securing an add-in circuit card in a personal computer including a clamp pivotally coupled to the computer, the clamp configured to releasably engage the card upon pivoting of the clamp from a card engagement position in which the clamp is substantially inside the computer to a card disengagement position in which the clamp is substantially outside the computer. The apparatus also includes a switch for controlling electrical power to the card, the switch operated by the clamp such that pivoting of the clamp between the engagement and disengagement positions causes a cam surface on the clamp to close and open the switch. The apparatus also includes an indicator light operatively coupled to the switch to indicate the open or closed state of the switch.

In general, in one aspect, the invention features a method of securing a card in an electronic device including the steps of inserting the card into a slot of the electronic device, and engaging the card with a clamp movably coupled to the electronic device, the clamp configured to releasably engage the card upon movement of the clamp from a card engagement position in which the clamp is substantially inside the electronic device to a card disengagement position in which the clamp is substantially outside the electronic device.

Certain implementations of the method include one or more of the following features. In certain implementations, the method further includes: coincident with the engaging step, the step of switching electrical power to the slot from an off state to an on state by contacting a switch with the clamp; and the step of signaling the on/off state of the slot to a user of the electronic device.

In general, in one aspect, the invention features a method of removing a card from an electronic device having an activated power source, including the steps of disengaging from the card a clamp movably coupled to the electronic device, the clamp operatively coupled to a switch that terminates power delivery to the card upon disengagement of the clamp, and extracting the card from the electronic device.

In general, in one aspect, the invention features a method of adding an add-in card to an electronic device including the steps of inserting the card into the electronic device, and engaging the card with a clamp movably coupled to the electronic device, the clamp operatively coupled to a switch that activates power delivery to the card upon engagement of the clamp.

Among the advantages of the invention may be one or more of the following. Because neither tools nor additional hardware are required, option cards may be easily inserted, secured, and removed from electronic devices. By using a clamp to secure the card within the electronic device, option cards may be exchanged without the attendant risk of losing screws or other attachment hardware. This feature also eliminates the risk of damage associated with dropping screws or tools on the board during the process of inserting or removing an option card. When used in combination with a switch, the clamp eliminates the need to shut off power to the entire electronic device. This feature not only speeds replacement of option cards, but also reduces the risk of electrical shock to the user.

Other advantages and features will become apparent from what follows.

DESCRIPTION

Figure 1:
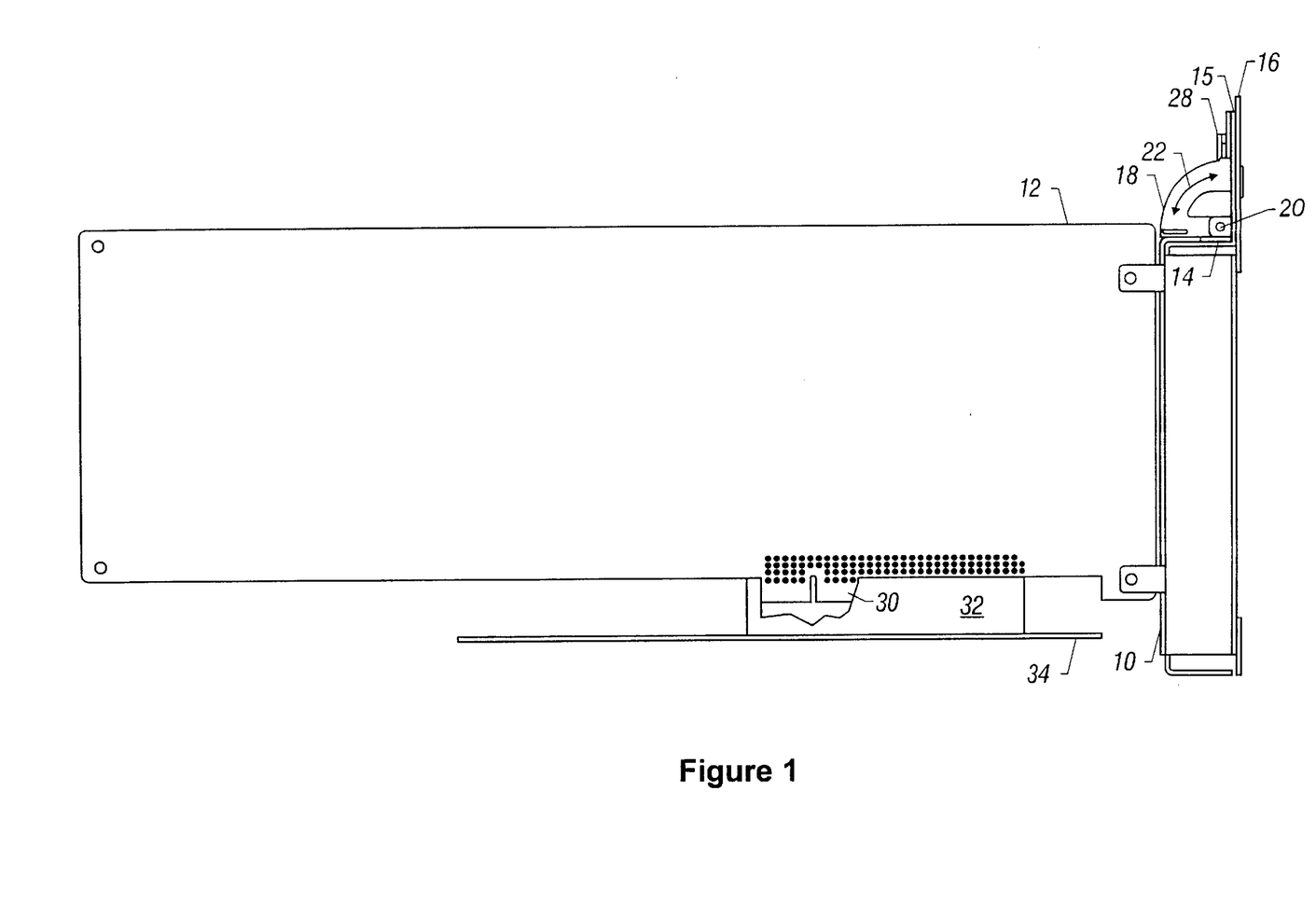
FIG. 1 is a side view of an option card secured by a clamp.

Referring to FIG. 1, the mounting bracket 10 of an option card 12 may be secured by a clamp 18 to a shelf 14 connected to a sheet metal chassis 16 of a personal computer or an expansion box for a personal computer. The shelf 14 includes a vertical surface 15 and a bracket retention tab 17 (see FIGS. 2A and 2B). The bracket retention tab 17 protrudes from the shelf 14 and engages a tab void (see e.g., FIG. 8) in the bracket 10 of the option card 12. The bracket retention tab 17 may accommodate either conventional mounting brackets and blank brackets (see FIG. 8) or blank brackets specifically designed for use with the clamp 18 (see FIGS. 7A–7C). Option cards secured by a clamp in a tower configuration central processing unit (i.e., where the cards are inserted into a slot in a direction which is perpendicular to the gravity vector) are supported, in part, by the interaction of the retention tab with the tab void of the bracket (see e.g., FIG. 8).

Figures 2A, 2B, 2C, 2D, 2E:
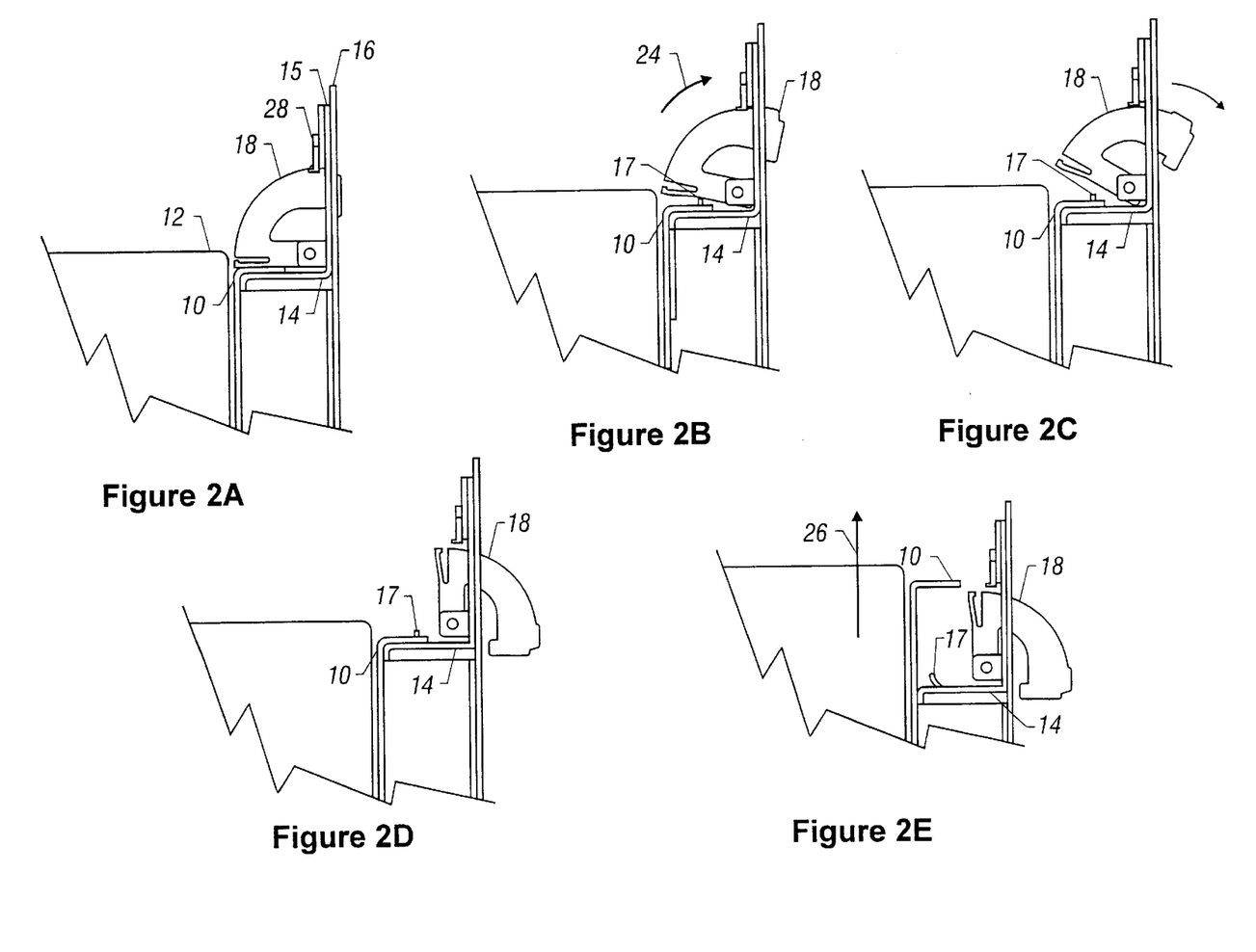
FIGS. 2A–2E show the process of removing an option card secured by a clamp.

The clamp 18 pivots about a bearing 20 along the path depicted by the doubleheaded arrow 22. As shown in FIGS. 2A–2D, the clamp 18 may be pivoted from a closed position (FIG. 2A) through intermediate positions (FIGS. 2B, 2C) to an open position (FIG. 2D). In the open position, the option card 12 may be removed along the path depicted by the arrow 26 (FIG. 2E). The position of the clamp 18 also determines whether a switch 28 is in an on (FIG. 2A) or an off (FIGS. 2D–2E) position. In the on position (FIG. 2A), the switch 28 is depressed (i.e., forced upward) which indicates to the computer operating system (not shown) to deliver signals and power to the contact surface 30 of the option card 12 via a slot 32 of a board 34. Conversely, in the off position (FIGS. 2D–2E), the switch 28 is released (i.e., allowed to return to a downward position) which indicates to the computer operating system to terminate signals and power delivery to the option card 12.

Figure 3:
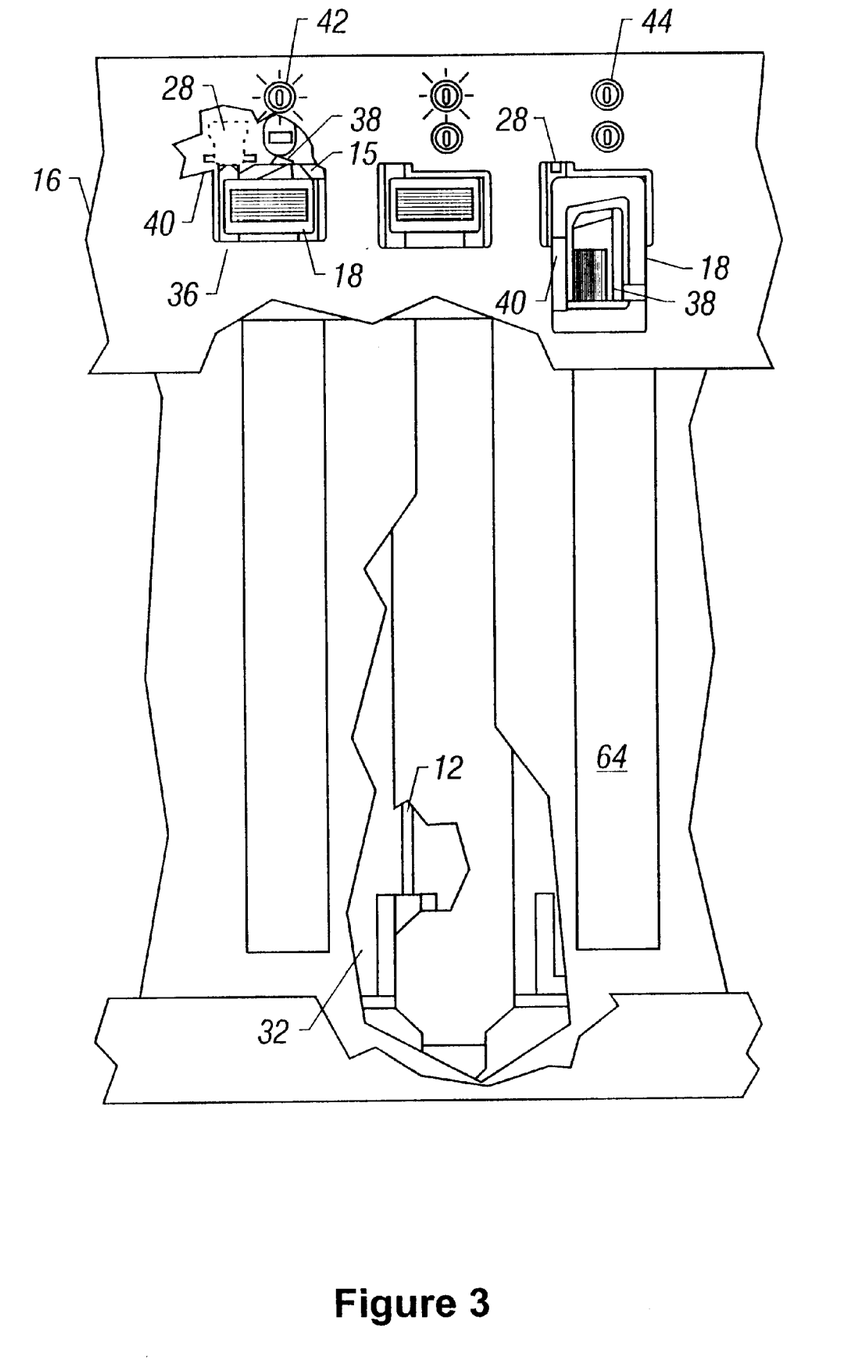
FIG. 3 is an exterior rear view of a clamp coupled to a computer related device.
Figure 4:
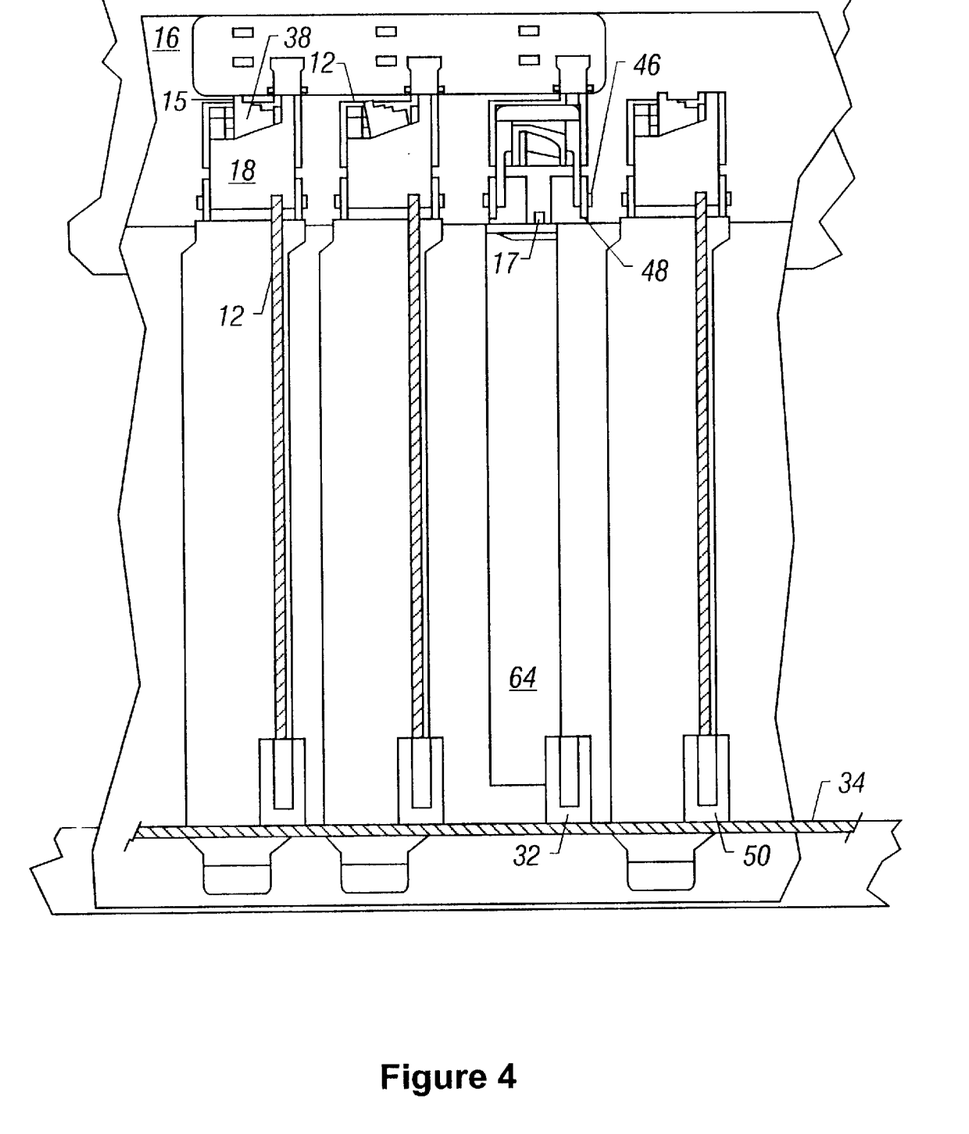
FIG. 4 is an interior rear view of a clamp coupled to a computer related device.

Referring to FIG. 3, the clamp 18 is maintained in the closed position within an opening 36 in the sheet metal chassis 16 by the interaction of a cantilevered spring release tab 38 with the vertical surface 15 of the shelf 14 (see also FIGS. 1, 2A and 4). As depicted in the left one-third of FIG. 3, when the clamp 18 is in the closed position, a cam 40 of the clamp 18 (see FIG. 5E) depresses the switch 28 and the on position of the switch 28 is indicated by an illuminated status indicator LED 42. In contrast, when the clamp 18 is pivoted to the open position, the switch 28 is released and the off position is indicated by a darkened status indicator LED 44. Thus, the illuminated and darkened status indicator LEDs 42, 44 signal the user when it is unsafe and safe, respectively, to insert or remove an option card 12 from the slot 32.

The process of removing an option card which has been secured with the clamp 18 may be seen in the left three-fourths of FIG. 4. From left to right, the option card 12 is secured by the clamp 18, in part, by the interaction of the cantilevered spring release tab 38 in its rest position (i.e., extended upward) with the vertical surface 15 of the shelf 14. The cantilevered spring release tab 38 is depressed by the finger of a user to allow the clamp 18 to extend through the opening 36 by pivoting about the pivot pins 46 inserted into the eyelet tabs 48 of the shelf 14. Once the clamp 18 has been rotated to its full open position, the switch 28 has been released to its off position, and power to the slot 32 has been terminated, the option card 12 may be safely removed. In another scheme (see right one-fourth of FIG. 4), the clamp 18 may be used to secure an option card within a slot 50 which is not coupled to a switch. In this scheme, power to the board 34 must be interrupted by the user prior to removing or replacing the option card 12.

Figure 5A:
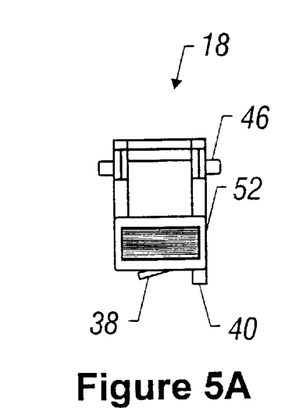
FIGS. 5A–5F are exterior, interior, top, left side sectional (at A—A of FIG. 5C), right side, and bottom views of a clamp, respectively.
Figure 5B:
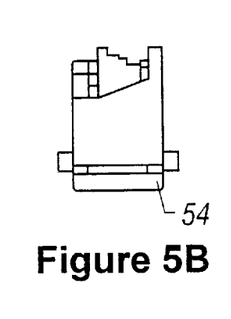
Figure 5C:
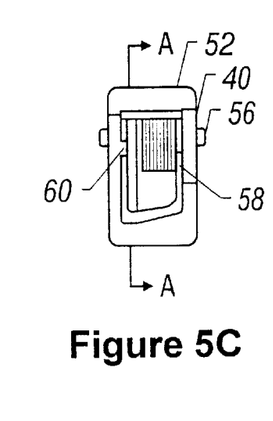
Figure 5D:
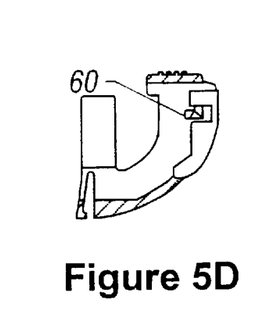
Figure 5E:
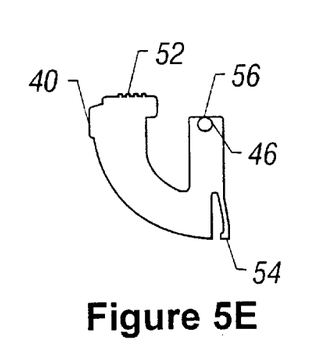
Figure 5F:
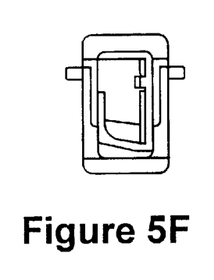

The structural detail of the clamp 18 may be appreciated by reference to FIGS. 5A–5E. Referring to FIG. 5A, the clamp 18 includes a serrated closure surface 52 which, in operation, is depressed by a user to effect pivoting of the clamp 18 from an open position (see FIG. 2E) to a closed position (see FIG. 2A). In operation, a cantilevered spring foot 54 is compressed when the clamp 18 is in the closed position (see FIG. 5B). Compression of the cantilevered spring foot 54 creates a rotational force which facilitates retention of the clamp 18 in the closed position (see FIG. 2A) via the engagement of release tab 38 with the vertical surface 15 of the shelf 14 (see FIGS. 3 and 4). Once the cantilever spring release tab 38 has been disengaged from contact with the vertical surface 15 of the shelf 14, the rotational force created by the cantilevered spring foot 54 urges the clamp 18 toward its open position (see FIG. 2E). Referring to FIG. 5C, the pivot pins 46 further include a chamfered surface 56 which facilitates insertion of the pivot pins 46 into the eyelet tabs 48 of the shelf 14. The cantilevered spring release tab 38 further includes a serrated release surface 58 which facilitates the depression of the cantilevered spring release tab 38 by a user preparing to remove the option card 12 (see FIG. 4). A support shelf 60 is positioned a fixed distance below the cantilevered spring release tab 38 to prevent excessive depression and possible breakage of the cantilevered spring release tab 38 (see FIG. 5D).

Figure 6:
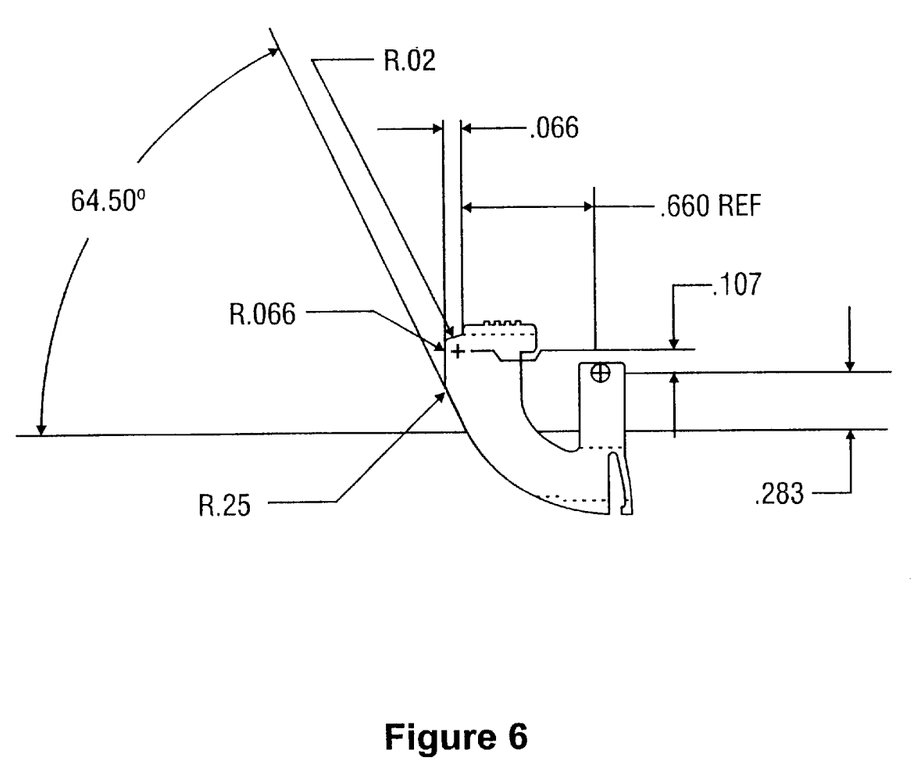
FIG. 6 is a right side view of a clamp.

Referring to FIG. 6, in one example, the clamp 18 is made from plastic by conventional injection molding techniques, and is characterized by the specific dimensions noted.

Figure 7A:
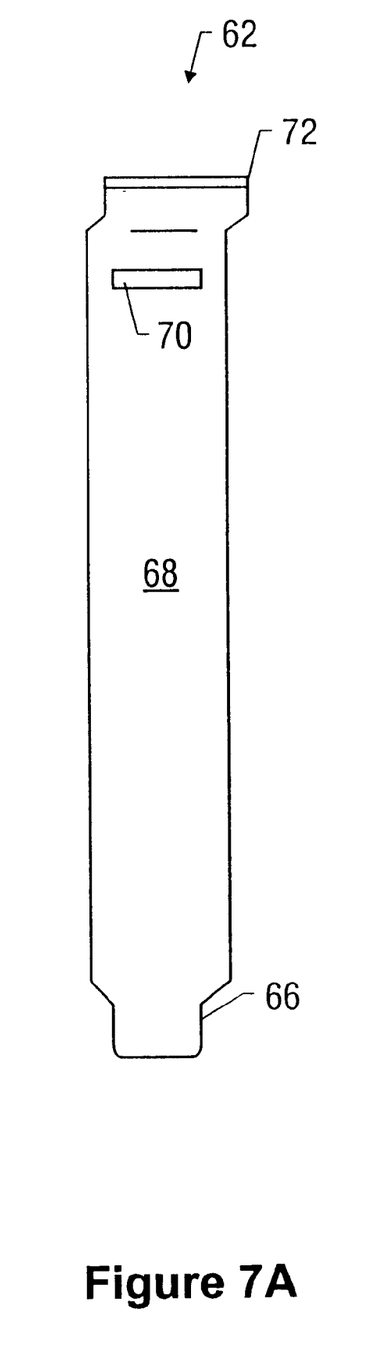
FIGS. 7A–7C are rear, top perspective, and side views of a blank bracket.
Figure 7B:
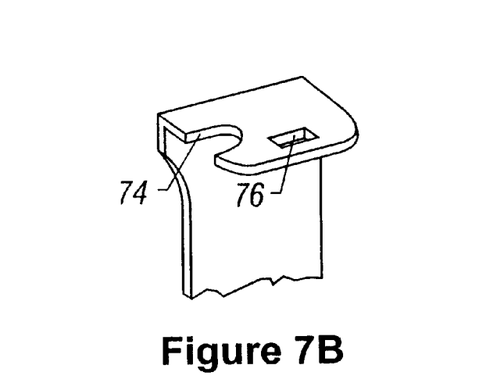
Figure 7C:
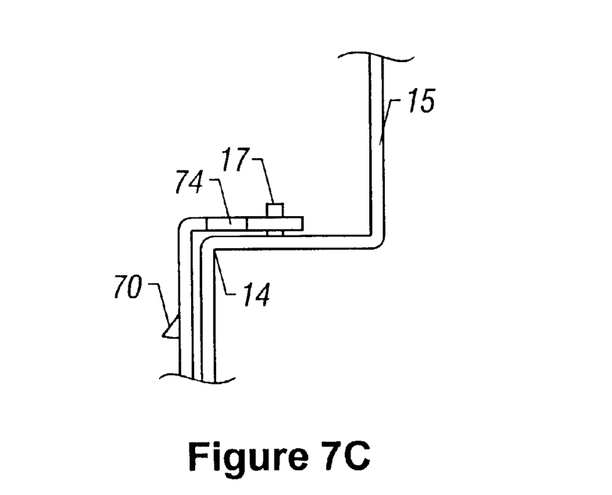
Figure 8:
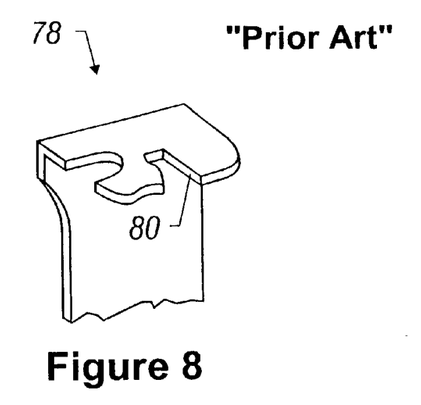
FIG. 8 is a top perspective view of a prior art bracket.

Referring to FIGS. 7A–7C, in circumstances where a particular slot is empty (e.g., because an option has been removed) a blank bracket 62 may be used to cover the opening 64 in the chassis 16 (see FIGS. 3 and 4). The blank bracket is secured by the clamp in a similar manner as described for an option card. The blank bracket 62 includes a foot end 66, a body 68 having a removal tab 70, and a head end 72. Referring to FIG. 7B, the head end 72 of the bracket 62 includes a screw recess 74 and a tab void 76 which receives the bracket retention tab 17 (see FIG. 7C). In contrast to a prior art blank bracket 78 (see FIG. 8) which has a tab slot 80, the tab void 70 of the blank bracket 62 is closed on all sides. This feature facilitates the retention of a blank bracket 62 by the clamp such that it may not be easily displaced by forces applied from outside the chassis (i.e., as may be possible for a prior art bracket 78). In addition, the removal tab 70 reduces the risk of dropping the blank bracket 62 on the board during its removal or insertion.

Other embodiments are within the scope of the following claims.

What is claimed is:

1. A housing for an electronic apparatus, the housing comprising:

a chassis including a location to secure a printed circuit card; and a clamp rotationally attached to the chassis, said clamp comprising a pivot pin positioned near a center point of a circle defined by a path of movement of the clamp, the clamp configured to exert a force on a surface of the printed circuit card toward the interior of the housing when rotated from a card disengagement position to a card engagement position, and to releasably secure the printed circuit card upon rotation of the clamp from the card engagement position to the card disengagement position.

2. The housing of claim 1 comprising a housing for a computer system, the chassis including a second location to secure a computer motherboard.

3. The housing of claim 2 and further comprising a computer motherboard secured in the second location.

4. The housing of claim 3 wherein a printed circuit card is electrically coupled to the computer motherboard, the printed circuit card being secured in the location by the clamp.

5. The housing of claim 1 wherein the clamp is substantially quarter-circular in shape.

6. The housing of claim 1 wherein the clamp comprises one of a plurality of clamps rotationally coupled to the chassis.

7. The housing of claim 1 wherein the force is exerted by a spring-loaded foot on an end of the clamp.

8. The housing of claim 7 wherein the clamp comprises a finger pressing surface on an opposite end of the clamp.

9. A housing for an electronic apparatus, the housing comprising:
   a chassis including a location to secure a printed circuit card; and
   a clamp rotationally attached to the chassis, the clamp configured to exert a force on a surface of the printed circuit card toward the interior of the housing when rotated from a card disengagement position to a card engagement position, and to releasably secure the printed circuit card upon rotation of the clamp from the card engagement position to the card disengagement position; and
   a detector coupled to the chassis, the detector including an output signal path to carry a signal indicating whether a circuit card has been secured in the location.

10. The housing of claim 9 and further comprising a visible indicator coupled to the detector, the visible indicator providing a visible indication whether a circuit card has been secured in the location.

11. The housing of claim 10 wherein the visible indicator comprises an LED.

12. The housing of claim 9 wherein the detector is configured to communicate with an operating system.

13. A computer system comprising:
   a motherboard including a plurality of electrical connectors;
   a chassis adjacent the motherboard, the chassis including a location to secure a printed circuit card; and
   a clamp rotationally attached to the chassis, said clamp comprising a pivot pin positioned near a center point of a circle defined by a path of movement of the clamp, the clamp configured to exert a force on a surface of the printed circuit card toward the interior of the housing when rotated from a card disengagement position to a card engagement position, and to release the printed circuit card upon rotation of the clamp from the card engagement position to the card disengagement position.

14. The system of claim 13 and further comprising a printed circuit card secured in the location, the printed circuit card including an electrical connector electrically coupled to one of the electrical connectors of the motherboard.

15. The system of claim 13 wherein the clamp comprises one of a plurality of clamps coupled to the chassis.

16. The system of claim 13 wherein the computer system comprises a personal computer.

17. The system of claim 13 wherein the computer system comprises a computer expansion box.

18. The system of claim 13 wherein the clamp is substantially quarter-circular in shape.

19. The system of claim 13 and further comprising a switch for controlling electrical power to the card, the switch operated by the clamp such that movement of the clamp between the card engagement position and the card disengagement position closes and opens the switch.

20. The system of claim 19 wherein the clamp comprises a cam surface which depresses and releases the switch upon movement of the clamp between the card engagement and disengagement positions.

21. The system of claim 19 wherein the switch is positioned opposite a pivot pin about which the clamp pivots between the card engagement and disengagement positions.

22. The system of claim 13 and further comprising a detector coupled to the chassis, the detector indicating whether a circuit card has been secured in the location, the detector configured to communicate with an operating system.

23. The system of claim 22 wherein the detector communicates with the operating system to control the delivery of signals and electrical power to the card.

24. The system of claim 13 wherein the force is exerted by a spring-loaded foot on an end of the clamp.

25. The system of claim 24 wherein the clamp comprises a finger pressing surface on an opposite end of the clamp.

26. A computer system comprising:
   a motherboard including a plurality of electrical connectors;
   a chassis adjacent the motherboard, the chassis including a location to secure a printed circuit card; and
   a clamp rotationally attached to the chassis, the clamp configured to exert a force on a surface of the printed circuit card toward the interior of the housing when rotated from a card disengagement position to a card engagement position, and to release the printed circuit card upon rotation of the clamp from the card engagement position to the card disengagement position; and
   further comprising a detector coupled to the chassis, the detector including an output signal path to carry a signal indicating whether a circuit card has been secured in the location.

27. The system of claim 26 and further comprising a visible indicator coupled to the detector, the visible indicator providing a visible indication whether a circuit card has been secured in the location.

28. The system of claim 27 wherein the visible indicator comprises an LED.

29. A computer system comprising:
   a motherboard including a plurality of electrical connectors;
   a chassis adjacent the motherboard, the chassis including a location to secure a printed circuit card; and
   a clamp rotationally attached to the chassis, the clamp configured to exert a force on a surface of the printed circuit card toward the interior of the housing when rotated from a card disengagement position to a card engagement position, and to releasably secure the printed circuit card upon rotation of the clamp from the card engagement position to the card disengagement position; and further comprising a switch for controlling the delivery of signals and electrical power to the card, the switch operated by the clamp such that pivoting of the clamp between the engagement and disengagement positions causes a cam surface on the clamp to close and open the switch.

30. A housing for an electronic apparatus, the housing comprising:

a chassis including a location to secure a printed circuit card; and clamp means rotationally coupled to the chassis, the clamp means for exerting a force on a surface of the printed circuit card, when positioned in said location, toward the interior of the housing when rotated from a card disengagement position to a card engagement position, the clamp means also for releasing said circuit card upon rotation of the clamp means from the card engagement position to the card disengagement position; said clamp means including a pivot pin positioned near a center point of a circle defined by a path of movement of the clamp means.

31. The housing of claim 30 and further comprising detecting means for detecting whether a circuit card has been secured in the location.

32. The housing of claim 31 and further comprising indicating means coupled to the detecting means, the indicating means for providing a visible indication whether a circuit card has been secured in the location.

33. A method of securing a card in computer system housing, the housing including a clamp rotationally connected to the housing, the card having a clamp engagement surface, the method comprising:

inserting the card into a slot of the computer system housing;

securing the card with the clamp, the clamp configured to exert a force on the engagement surface of the card toward the slot upon movement of the clamp from a card disengagement position to a card engagement position and to substantially release the force upon movement of the clamp from the card engagement position to the card disengagement position, and generating an electrical signal to indicate the presence of the card in the slot.

34. The method of claim 33 and further comprising identifying the presence of a card in the slot to a user of the computer system.

35. The method of claim 33 and further comprising removing the card from the slot.

36. The method of 35 wherein removing the card comprises:

disengaging the card with the clamp, the clamp operatively coupled to a switch that terminates power delivery to the card upon disengagement of the clamp; and extracting the card from the electronic device.

37. A method of securing a card in computer system housing, the housing including a clamp rotationally connected to the housing, the card having a clamp engagement surface, the method comprising:

inserting the card into a slot of the computer system housing;

securing the card with the clamp, the clamp configured to exert a force on the engagement surface of the card toward the slot upon movement of the clamp from a card disengagement position to a card engagement position and to substantially release the force upon movement of the clamp from the card engagement position to the card disengagement position, and wherein effecting the securing step switches the delivery of signals and electrical power to the slot from an off state to an on state by contacting the clamp with a switch.

* * * * *

UNITED STATES PATENT AND TRADEMARK OFFICE
CERTIFICATE OF CORRECTION

PATENT NO.    : 6,069,796
DATED         : May 30, 2000
INVENTOR(S)   : Robert J. Hastings; Paily T. Varghese; Joseph R. Allen It is certified that error appears in the above-identified patent and that said Letters Patent is hereby corrected as shown below:

Title page, left column, change:
[73] Assignee: Sharp, Comfort & Merrett, P.C., Houston, Tex. to:

[73] Assignee: Compaq Computer Corporation, Houston, Tex.

Signed and Sealed this

Fourteenth Day of August, 2001

*Attest:*

NICHOLAS P. GODICI
*Attesting Officer*    Acting Director of the United States Patent and Trademark Office